United States Patent
Morrison et al.

(10) Patent No.: US 10,359,241 B2
(45) Date of Patent: Jul. 23, 2019

(54) USING A CONDUCTIVE SHEET THAT INCLUDES GRAPHENE FOR THERMAL CONDUCTIVITY AND FOR GROUNDING

(71) Applicant: Dell Products L. P., Round Rock, TX (US)

(72) Inventors: John Trevor Morrison, Round Rock, TX (US); Jace W. Files, Round Rock, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 253 days.

(21) Appl. No.: 15/609,713

(22) Filed: May 31, 2017

(65) Prior Publication Data

US 2018/0347921 A1    Dec. 6, 2018

(51) Int. Cl.
*G06F 1/20* (2006.01)
*H05K 7/20* (2006.01)
*F28F 21/02* (2006.01)
*H01L 23/373* (2006.01)
*H01L 23/427* (2006.01)
*F28D 15/02* (2006.01)
*F28D 21/00* (2006.01)

(52) U.S. Cl.
CPC .............. *F28F 21/02* (2013.01); *G06F 1/203* (2013.01); *H01L 23/3733* (2013.01); *H01L 23/427* (2013.01); *H05K 7/2039* (2013.01); *H05K 7/20336* (2013.01); *F28D 15/02* (2013.01); *F28D 2021/0029* (2013.01)

(58) Field of Classification Search
CPC ..................................................... G06F 1/1683
See application file for complete search history.

(56) References Cited

U.S. PATENT DOCUMENTS

| 5,371,324 | A | * | 12/1994 | Kanno | H01B 7/0018 |
| | | | | | 174/117 F |
| 5,757,615 | A | * | 5/1998 | Donahoe | G06F 1/203 |
| | | | | | 165/104.33 |
| 6,075,696 | A | * | 6/2000 | Progl | G06F 1/203 |
| | | | | | 16/226 |
| 8,675,363 | B2 | * | 3/2014 | Crooijmans | G06F 1/203 |
| | | | | | 361/679.26 |
| 9,545,030 | B2 | * | 1/2017 | Nikkhoo | H05K 7/20127 |
| 9,585,285 | B2 | * | 2/2017 | Nikkhoo | H05K 7/20127 |
| 9,659,870 | B2 | * | 5/2017 | Miyazaki | H01L 23/53276 |
| 9,768,483 | B2 | * | 9/2017 | Nawrocki | H01P 3/02 |
| 9,791,704 | B2 | * | 10/2017 | Nikkhoo | G02B 27/0176 |

(Continued)

*Primary Examiner* — Robert J Hoffberg
(74) *Attorney, Agent, or Firm* — Campbell Stephenson LLP; Shiv S. Naimpally

(57) ABSTRACT

In some examples, a computing device may include a set of components (e.g., processor, memory, and the like) and a conductive sheet (or cable). The conductive sheet (or cable) may include a first graphene layer to dissipate at least a portion of heat generated by a component (e.g., the processor) of the first set of components and a second graphene layer that is used as an electrical ground by signals communicated between a first component and a second component of the set of components. The computing device may include a single housing or a first housing (with a first display device) attached to a second housing (with a second display device) by one or more hinges.

20 Claims, 8 Drawing Sheets

(56) References Cited

U.S. PATENT DOCUMENTS

| | | | |
|---|---|---|---|
| 9,899,711 B2* | 2/2018 | Piggott | C09K 5/14 |
| 9,980,412 B2* | 5/2018 | Qiu | H05K 7/20509 |
| 9,986,667 B2* | 5/2018 | Nikkhoo | H05K 7/20127 |
| 10,028,418 B2* | 7/2018 | Nikkhoo | H05K 7/20963 |
| 10,108,017 B2* | 10/2018 | Nikkhoo | G02B 27/0176 |
| 10,146,278 B2* | 12/2018 | North | G06F 1/203 |
| 10,234,915 B2* | 3/2019 | Sun | B32B 37/14 |
| 2018/0226699 A1* | 8/2018 | Piggott | C09K 5/14 |
| 2018/0284856 A1* | 10/2018 | Shah | G06F 1/206 |
| 2019/0041922 A1* | 2/2019 | Kurma Raju | G06F 1/203 |

* cited by examiner

USING A CONDUCTIVE SHEET THAT INCLUDES GRAPHENE FOR THERMAL CONDUCTIVITY AND FOR GROUNDING

BACKGROUND OF THE INVENTION

Field of the Invention

This invention relates generally to computing devices and, more particularly, to using one or more graphene sheets in the computing device to provide both thermal conductivity (e.g., dissipating heat by transferring the heat from heat generating components) and a ground. For example, graphene, when purified an appropriate amount or doped with other materials, may provide superior conductivity to metals commonly used for a ground, such as copper alloy, steel alloy, or other metal alloys.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

While the form factor of computing devices, such as laptops, tablets, and phones, continues to get smaller (including thinner), the thermal characteristics (e.g., heat generation) of central processing units (CPUs) remains about the same. Thermal solutions to dissipate heat generated by components, such as the CPU, while maintaining or reducing the form factor may be difficult to achieve, particular as consumers and enterprises demand greater CPU performance (e.g., faster clock speed, more processing cores, and the like), which typically causes more heat to be generated. In addition, modern computing devices may use an architecture in which the majority of the heat-generating components (e.g., CPU, graphics processing unit (GPU), memory, solid state drive (SSD), and the like) are located in a small area relative to the size of the computing devices. Without a thermal solution that can (1) dissipate thermal energy while keeping the chassis of the computing device cool and (2) prevent CPU performance from being throttled, the size (including thickness) of the computing device may remain relatively large (e.g., thick), unsuitable for modern applications, and uncompetitive in the marketplace.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device may include a set of components (e.g., processor, memory, and the like) and a conductive sheet (or cable). The conductive sheet (or cable) may include a first graphene layer to dissipate at least a portion of heat generated by a component (e.g., the processor) of the first set of components and a second graphene layer that is used as an electrical ground by signals communicated between a first component and a second component of the set of components. The computing device may include a single housing or a first housing (with a first display device) attached to a second housing (with a second display device) by one or more hinges.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
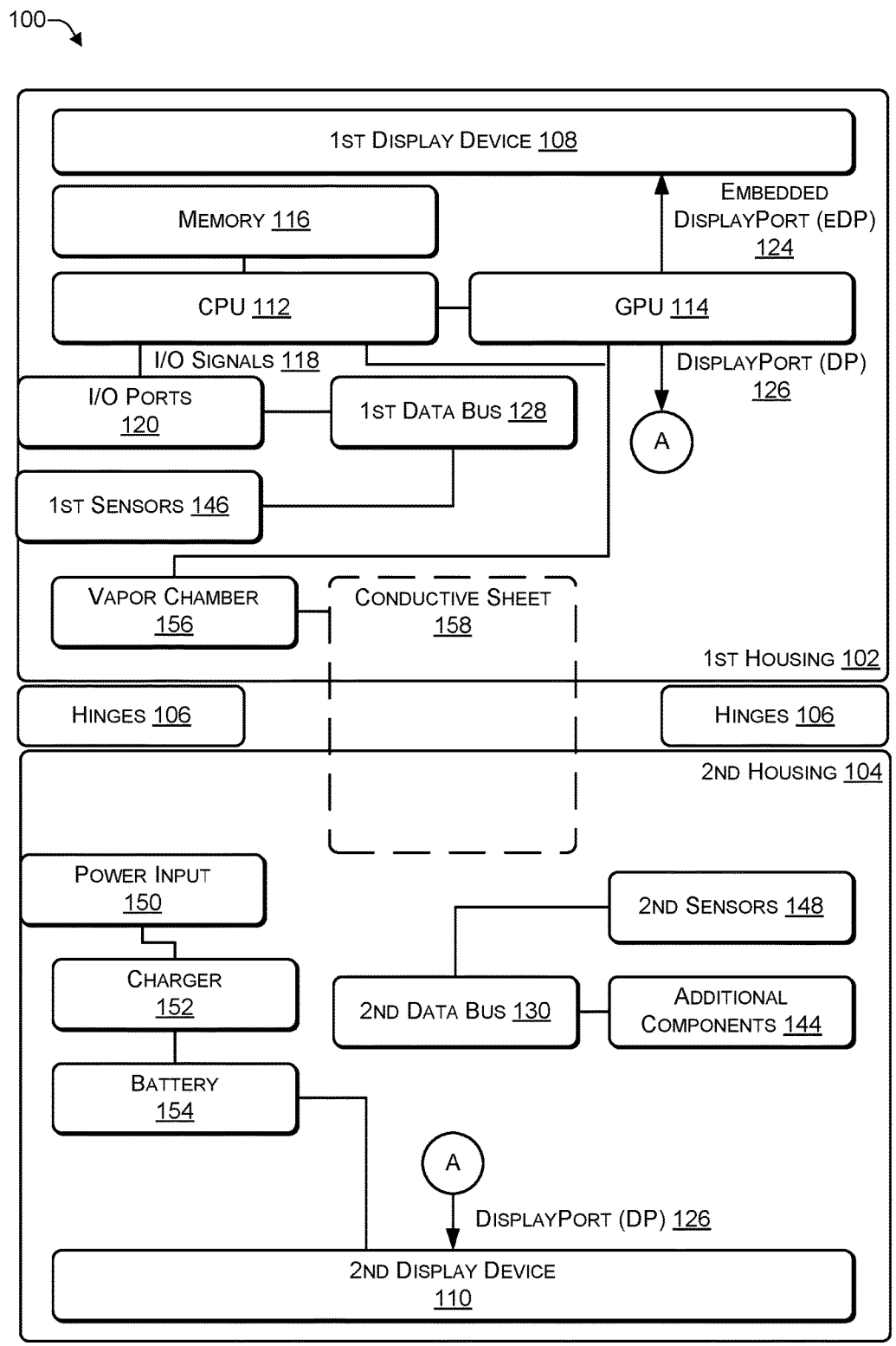
FIG. 1 is a block diagram of an architecture of a computing device according to some embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein use a conductive sheet (or cable) that is both thermally conductive and electrically conductive. By using the conductive sheet (or cable), two separate layers, e.g., a heat dissipation layer and a ground layer, can be combined, thereby enabling the thickness of the computing device to be reduced. For example, a computing device may use passive cooling, e.g., a fan may not be used to force air onto components for cooling. The advantage of passive cooling (as compared to using a fan) is that the amount of noise generated may be lower and heated air may not exit the computing device. The thermally conductivity may be used to dissipate heat caused by heat-generating components in a computing device. For example, the heat-generating components may be located in one portion of the computing device and the conductive sheet (or cable) may transfer the heat to another (e.g., cooler) portion of the computing device where the heat can be dissipated. The electrical conductivity may be used to provide an electrical ground for signals (e.g., data signals, power signals, and the like) being transmitted between components of the computing device. The conductive sheet (or cable) may be used in laptops, phones, tablets, desktop, 2-in-1 (e.g., a tablet head that can be attached to or detached from a base), or other types of computing device to provide both thermal conductivity and an electrical ground.

The conductive sheet (or cable) may be used in a computing device with two housings that are coupled to each other by a hinge. One of the housings may include computing components (e.g., typically found on a motherboard), such as central processing unit (CPU), a graphics processing (GPU), memory, and the like.

One or more of the components housed in the computing device may be in contact with a vapor chamber. A vapor chamber is a hollow cylinder (or other sealed shape) that includes a small amount of a liquid in a vacuum. The vapor chamber may be made using a metal alloy, such as copper alloy. When heat is present at one end of the vapor chamber, the heat may cause the liquid to vaporize. The vaporized liquid may condense back to a liquid at another (e.g., cooler) end of the vapor chamber. The vapor chamber may be used to cool one or more components, such as, for example, the CPU, the GPU, the memory devices, and the like.

The conductive sheet (or cable) may be in contact with the vapor chamber that is located in a first portion of the computing device that houses heat-generating components (e.g., CPU, GPU, memory, or the like). The conductive sheet may conduct heat from the first set of components (e.g., via the contact with the vapor chamber) to a second portion of the computing device where the heat is more easily dissipated (e.g., because a second set of components housed in the second portion generates less heat than the first set of components).

The conductive sheet (or cable) may include one or more layers of thermally conductive materials, such as graphite, copper, aluminum, another type of material, or any combination thereof. In some cases, such as when the computing device includes a first housing connected to a second housing by one or more hinges, the conductive sheet (or cable) may include three portions, e.g., a first portion in the first housing, a second portion in the second housing, and a third portion that thermally connects the first portion to the second portion. The third portion of the conductive sheet may be sufficient flexible to enable the first housing to be placed at an angle (e.g., preferably between about 0 to about 180 degrees or between about 0 to about 360 degrees) relative to the second housing. The third portion of the conductive sheet may be capable of thermally conducting heat from a warmer housing to a cooler housing while the first housing is placed at an angle relative to the second housing. In addition, the third portion of the conductive sheet may be designed to be repeatedly flexed (e.g., articulated) without breaking (or other damage) for an expected life of the computing device. In some cases, the third portion of the conductive sheet may be placed inside the one or more hinges that are used to couple the first housing to the second housing of the computing device. For example, by using a conductive sheet made of graphene, a flexible material, the conductive sheet can be used for both housings by threading the conductive sheet through hollowed out hinges. In some cases, a portion of the conductive sheet may protrude outside the first housing and the second housing around the hinge area. In such cases, the exposed conductive sheet may be protected using a cover made out of leather, plastic, cloth, or other flexible material with insulating properties.

By using a conductive sheet, the temperature difference between two portions (or two housings) of the computing device may be reduced to less than a pre-determined threshold (e.g., preferably less than 6 degrees Fahrenheit and more preferably less than 4 degrees Fahrenheit). For example, the temperature difference between two different portions of the computing device may be reduced to a level that does not cause users to become concerned. Furthermore, a conductive sheet that spans both housings of a computing device may distribute the thermal load across both sides (e.g., housings), approximately doubling the surface area used for thermal dissipation. By increasing thermal dissipation using a conductive sheet, components that use more power may be used in the design of the computing device. The increased thermal dissipation may enable the computing device to support computational components that consume more power (e.g., thereby generating more heat), such as a CPU with more cores, a CPU with a faster clock speed, a more powerful (e.g., more pipelines, faster clock speed, or the like) GPU, more memory, a faster memory, or any combination thereof.

The conductive sheet includes one or more graphene layers to enable the conductive sheet to be used for cooling (e.g., thermal dissipation) and an electrical ground (e.g., signaling ground reference). For example, the conductive sheet may include a conductive layer (e.g., a metal alloy, such as copper alloy) that is "sandwiched" between two layers of graphene. The graphene layers may be used as (i) a continuous reference plane for signal integrity and (ii) ground coupling for noise suppression. The graphene reference planes may be in contact with a thermal solution (e.g., vapor chamber) on either side to enable heat transfer between the two ends of the sheet.

Thus, a conductive sheet (or cable) having at least one graphene layer may be placed in a computing device. For example, the conductive sheet (or cable) may be placed in a first housing, a second housing, and across a gap between the two housings. A cover may be used to protect the portion of the conductive sheet that is exposed (e.g., across the gap between the two housings). The conductive sheet may attach to a heat dissipation device, such as a vapor chamber, that is attached to heat generating components (e.g., CPU, GPU, memory, and the like) in a first housing. The conductive sheet may draw heat from the vapor chamber in the first housing and spread and dissipate the heat at a second housing. The conductive sheet may use a flexible, thermally conductive material, such as graphene to enable the first housing to flex and be placed at different angles relative to the second housing. The conductive sheet may have electrical characteristics that enable the conductive sheet (or cable) to be used as a ground. For example, a conductive layer of the conductive sheet (or cable) may be comprised of a metal alloy (e.g., copper alloy) may be used to communicate signals while the graphene layer(s) of the conductive sheet may be used as an electrical ground for the signals. The signals may include data signals (e.g., including video data, audio data, files, and the like), power signals, and other electrical or electronic signals communicated in a computing device. Examples of how a conductive sheet (or cable) may be used in a computing device are provided below.

As a first example, a computing device may include a set of components (e.g., processor, memory, and the like) and a conductive sheet. The conductive sheet may include (i) a first graphene layer to dissipate at least a portion of heat generated by a component of the first set of components and (ii) a second graphene layer that is used as an electrical ground by signals communicated between a first component and a second component of the set of components. For example, the signals communicated between the first component and the second component may include a data signal or a power signal. The first layer of graphene may be in contact with a heat sink (e.g., a vapor chamber) attached to at least one component of the set of components. The conductive sheet may include a conductive layer to transmit the signals communicated between the first component and the second component. The conductive sheet may include one or more openings through which a cable is routed to contact one of (i) the conductive layer, (ii) the first graphene layer, or (iii) the second graphene layer. In some cases, the conductive sheet may include a routing layer through which one or more cables may be routed.

As a second example, a computing device may include a first housing coupled to a second housing by one or more hinges and a conductive sheet. The first housing may be used to house a first display device and a first set of components. A heat sink may be in contact with at least a first component of the first set of components. The second housing may include a second display device and a second set of components. The conductive sheet may include (i) a first graphene layer to dissipate at least a portion of heat generated by the first set of components and (ii) a second graphene layer that is used as an electrical ground by signals communicated between a first component of the first set of components and a second component of the second set of components. For example, the signals communicated between the first component and the second component may include a data signal, a power signal, or another type of electrical or electronic signal. The first layer of graphene may be in contact with a heat sink attached to at least one component of the first set of components. The first graphene layer, the second graphene layer, or both may be doped using at least one of potassium nitrate (KNO3), lithium (Li), or gold(III) chloride (AuCl3). The conductive sheet may include a conductive layer to transmit the signals communicated between the first component and the second component. The conductive sheet may include one or more openings through which a cable is routed to contact one of: (i) the conductive layer, (ii) the first graphene layer, or (iii) the second graphene layer. In some cases, the conductive sheet may include a routing layer through which one or more cables may be routed.

As a third example, a computing device may include a set of components (e.g., a central processing unit (CPU)) and a cable that includes (i) a conductor to communicate signals between a first component and a second component of the set of components and (ii) a graphene layer to dissipate at least a portion of heat generated by the CPU. The signals communicated between the first component and the second component may include a data signal or a power signal. In some cases, the graphene layer may, in addition to providing heat dissipation, provide an electrical ground to the signals communicated between the first component and the second component. In other cases, the cable may include a second graphene layer to electrically ground the signals communicated between the first component and the second component. The graphene layer is doped using at least one of potassium nitrate (KNO3), lithium (Li), or gold(III) chloride (AuCl3). The computing device may include a single housing or two housings in which a first housing (with a first display device) is attached to a second housing (with a second display device) by one or more hinges.

FIG. 1 is a block diagram of an architecture of a computing device according to some embodiments. In some implementations, the computing device 100 may include two (or more) housings while in other implementations the computing device 100 may include a single housing (e.g., a tablet form factor). As illustrated in FIG. 1, the computing device 100 may include a first housing 102 coupled to a second housing 104 via one or more hinges 106. The hinges 106 may enable the two housings 102, 104 to be positioned at different angles relative to each other in different orientations (e.g., various vertical orientations and various horizontal orientations). Of course, additional housings may be attached via additional hinges to create a computing device with multiple housings. In a single housing computing device, the hinges 106 may be absent and the components of the computing device 100 may be located in a single housing (e.g., the first housing 102).

A first display device 108 may be located in the first housing 102 and, in some cases (e.g., in a dual-display device), a second display device 110 may be located in the second housing 104. A first portion of the components of the computing device 100 may be located in the first housing 102 (e.g., behind the first display device 108) while a remaining portion of the components of the computing device 100 may be located in the second housing 104 (e.g., behind the second display device 110). For example, as illustrated in FIG. 1, the components located in the first housing 102 may include at least one central processing unit (CPU) 112, a graphics process unit (GPU) 114, and a memory (e.g., computer-readable media) 116. The GPU 114 may be integrated into the CPU 112 or may be a separate device from the GPU 114. In some cases, a computer motherboard that includes the CPU 112, the memory 116, and the like may be located in the first housing 102.

The CPU 112 may communicate input/output (I/O) signals 118 via multiple I/O post 120. The I/O ports 120 may include video ports (e.g., a video graphics adapter (VGA) port, a digital video interface (DVI) port, a high definition media interface (HDMI) port, a ThunderBolt® port, or the like), audio ports (e.g., microphone jack, headphone jack, and the like), data ports (e.g., universal serial bus (USB) ports compliant with USB 2.0, USB 3.0, and the like), communication ports (e.g., Ethernet and the like), another type of port, or any combination thereof. In some cases, the computing device 100 may include at least one digital signal processing (DSP) processor to perform audio (and video) signal processing. The GPU 114 may provide two or more lanes of embedded DisplayPort (eDP) output 124 that are sent to the first display device 108 in the first housing 102 and two or more lanes of DisplayPort (DP) output 126 that are sent (e.g., wirelessly or via a cable) to the second display device 110 in the second housing 104.

A first data bus 128 in the first housing 102 and a second data bus 130 in the second housing 104 may distribute data among the various components of the computing device 100. For example, the data buses 128, 130 may distribute data from the I/O signals 118, the I/O ports 120, a first set of sensors 146, a second set of sensors 148, and additional components 144. For example, the data buses 128, 130 may distribute data by receiving data from a component of the computing device 100 and transmitting the data to one or more of the other components of the computing device 100.

The second housing 104 may include a remaining portion of the components of the computing device 100. In some cases, the components in the second housing 104 may be located behind the second display device 110. In a single housing computing device, the second display device 110 may not be present. The second housing 104 may include the additional components 144 (e.g., keyboard, touchpad, trackball, speaker, microphone, Wi-Fi antenna, Bluetooth antenna, Zigbee Antenna, cellular antenna, and the like), the second set of sensors 148, a power input 150 (e.g., alternating current (AC) or direct current (DC) input), a charger 152, and a battery 154. The battery charger 152 may be used as a power source to provide power instead of (or in addition to) the battery 154 when the battery 154 is depleted or inoperable. In some cases, data cables may run through the hinges 106 to connect the components of the computing device 100 located in the first housing 102 with the components of the computing device 100 located in the second housing 104. In other cases, a first wireless transceiver in the first housing 102 and a second wireless transceiver in the second housing 104 may provide wireless communications between (1) the components of the computing device 100 located in the first housing 102 and (2) the components of the computing device 100 located in the second housing 104. The first set of sensors 146 and the second sensors 152 may include one or more of a touch-screen sensor, an accelerometer, a gyroscope, an electronic compass (e-compass), a barometer, a magnetometer, a proximity sensor, a light sensor, an imaging sensor (e.g., a camera), a fingerprint sensor, a global positioning satellite (GPS) sensor, another type of sensor, or any combination thereof.

One or more of the components, such as, for example, the CPU 112, the GPU 114, or the memory 116, may be in contact with a heat sink, such as, a vapor chamber 156. The vapor chamber 156 is a hollow cylinder, cube, or other sealed shape that includes a small amount of a liquid in a vacuum. The vapor chamber 156 may be made from a metal (or a metal alloy), such as copper (or a copper alloy). When heat is present at one end of the vapor chamber 156, the heat may cause the liquid to vaporize. The vaporized liquid may condense back to a liquid at another (e.g., cooler) end of the vapor chamber 156. The vapor chamber 156 may be used to cool the CPU 112 when the GPU 114 is integrated into the CPU 112. The vapor chamber 156 may be located in whichever of the housings 102, 104 is used to house the components generating a relatively large amount of heat. For example, as illustrated in FIG. 1, the vapor chamber 156 may be housed in the first housing 102 to cool the CPU 112 and the GPU 114.

A conductive sheet 158 may be in contact with the vapor chamber 156. The conductive sheet 158 may conduct heat from heat generating components (e.g., one or more of CPU 112, GPU 114, memory 116), via contact with the vapor chamber 156, to the second housing 104, where the heat is more easily dissipated because components (e.g., battery 154) housed in the second housing 104 may generate less heat than the components in the first housing 102. Thus, the conductive sheet 158 may span both the first housing 102 and the second housing 104 and may draw heat from components in one housing (e.g., the first housing 102) and dissipate the heat in another housing (e.g., the second housing 104).

The conductive sheet 158 may include one or more layers of thermally conductive materials, such as graphite, copper, aluminum, another type of material, or any combination thereof. In a dual housing computing device, the conductive sheet 158 may include 3 portions, e.g., a first portion in the first housing 102, a second portion in the second housing 104, and a third portion that thermally connects the first portion to the second portion. The third portion of the conductive sheet 158 may be sufficient flexible to enable the first housing 102 to be placed at an angle (e.g., preferably between about 0 to about 180 degrees or between about 0 to about 360 degrees) relative to the second housing 104. The third portion of the conductive sheet 158 may be capable of thermally conducting heat from the warmer housing (e.g., the first housing 102) to the cooler housing (e.g., the second housing 104) while enabling the first housing 102 to be placed at different angles relative to the second housing 104. In addition, the third portion of the conductive sheet 158 may be designed to be repeatedly flexed (e.g., articulated) without breaking (or other damage) for an expected life of the computing device 100. In some cases, the third portion of the conductive sheet 158 may be placed inside the one or more hinges 106 when the hinges 106 are fairly long and cover more than 50% of the length of the computing device 100. The conductive sheet 158 may be made of a flexible material, such as graphene, enabling a single graphene sheet to be used for both housings 102, 104.

In some cases, when the hinges are fairly long, the conductive sheet 158 may be threaded through hollow hinges 106. In other cases, when the hinges are fairly small, a portion of the conductive sheet 158 may protrude outside the first housing 102 and the second housing 104. In such cases, the exposed conductive sheet 158 (e.g., graphene sheet or other material) may be protected using a cover made out of leather, plastic, cloth, or other flexible material with insulating properties.

By using the conductive sheet 158 that spans both housings 102, 104, the temperature difference between the two housings of the computing device 100 may be reduced to less than a pre-determined threshold (e.g., preferably less than 6 degrees Fahrenheit and more preferably less than 4 degrees Fahrenheit). For example, the temperature difference between the two sides of the computing device 100 may be reduced to a level that does not cause users to become sufficiently concerned to call customer service. Furthermore, the conductive sheet 158 may distribute the thermal load across both housings 102, 104, approximately doubling the surface area available for thermal dissipation. By increasing thermal dissipation using the conductive sheet 158, components that use more power may be used in the design of the computing device 100. The increased thermal dissipation may enable the computing device 100 to support computational components that consume more power (e.g., thereby generating more heat). For example, the conductive sheet 158 may enable the computing device 100 to support the CPU 112 with more cores and/or a faster clock speed, a more powerful (e.g., more pipelines, faster clock speed, or the like) GPU 114, more memory 116, a faster memory 116, or any combination thereof. In addition, the conductive sheet 158 may be used as an electrical ground for signals transmitted among the various components of the computing device 100.

In FIG. 1, the first set of components of the computing device 100 shown as being located in the first housing 102 and the remaining set of components shown as located in the second housing 104 are purely for illustration purposes. Depending on the implementation, different components of the computing device 100 may be housed in one or both of the housings 102, 104. For example, when the computing device 100 is designed for graphics processing, the GPU 114 and supporting hardware (e.g., graphics support chips, graphics memory, and the like) may be housed in the second housing 104. As another example, in some cases, the ports 120 may be located in the first housing 102, in the second housing 104, or split between the two housings 102, 104. As a further example, the battery 154 may include multiple power cells, with a portion of the power cells located in the first housing 102 and zero or more of the power cells located in the second housing 104. In some cases, which components of the computing device 100 are located in each of the housings 102, 104 may be determined based on the thermal characteristics of the components. For example, the components may be distributed between the housings 102, 104 by grouping components that generate the most heat into the same housing, and using the conductive sheet 158 to cool that housing. In addition, while the computing device 100 is illustrated as having two display devices 108, 110, in some cases the computing device 100 may have a single display device, e.g., when the computing device 100 is configured as a tablet (e.g., all components in a single housing) or a laptop computing device (e.g., with a display in the first housing and input devices, such as a keyboard and touchpad, in the second housing).

Software instructions implementing an operating system and one or more applications, including at least one application capable of receiving stylus input, may be stored in the memory 116. The software instructions may be executed by the CPU 112, by the DSP processor, or any combination thereof.

Thus, a conductive sheet comprised of a single sheet may span a first housing, a second housing, and a gap between the two housings. The conductive sheet may have one or more layers of material, including an electrically and thermally conductive material, such as graphene. A cover may be used to protect the portion of the conductive sheet that is exposed (e.g., across the gap between the two housings). The conductive sheet may attach to a vapor chamber that is coupled to heat generating components (e.g., CPU, GPU, memory, and the like) in a first housing. The conductive sheet may draw heat from the vapor chamber in the first housing and dissipate the heat in a second housing. The conductive sheet may use a flexible, thermally and electrically conductive material, such as graphene, to enable the first housing to flex and be placed at different angles relative to the second housing. Of course, in a single housing computing device, the conductive sheet may be located in a single housing. The graphene layer(s) of the conductive sheet may be used as an electrical ground to enable transmitting signals (data signals, power signals, and the like) between the various components of the computing device 100.

Figure 2:
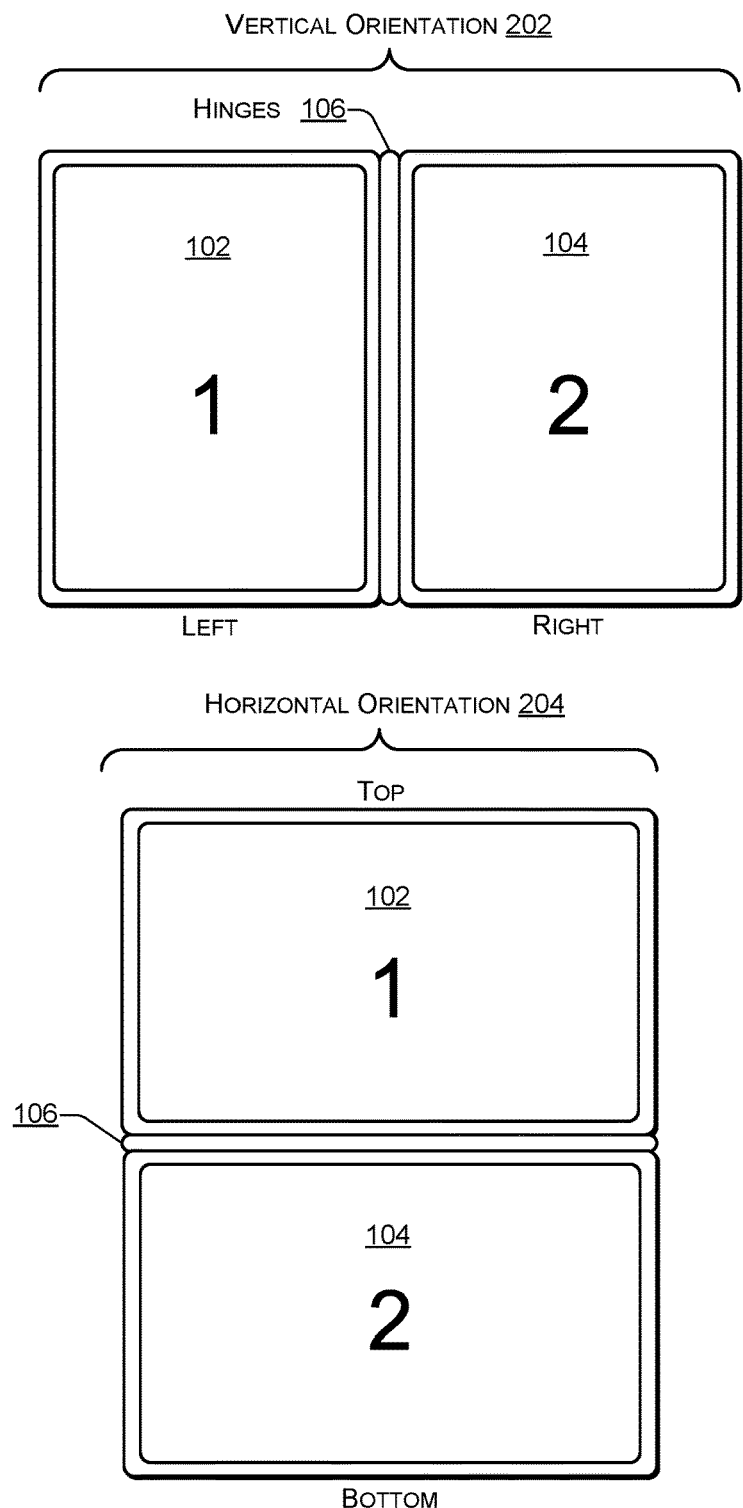
FIG. 2 is a block diagram illustrating different orientations of a dual-housing computing device according to some embodiments.

FIG. 2 is a block diagram illustrating different orientations of a dual-housing computing device (e.g., the computing device 100 of FIG. 1) according to some embodiments. The computing device 100 may include two housings 102, 104. One or both of the housings 102, 104 may include a display device. In some cases, one of the housings 102, 104 may include a display device and the other housing may include one or more input devices, such as a keyboard, trackpad, and the like.

Figure 3:
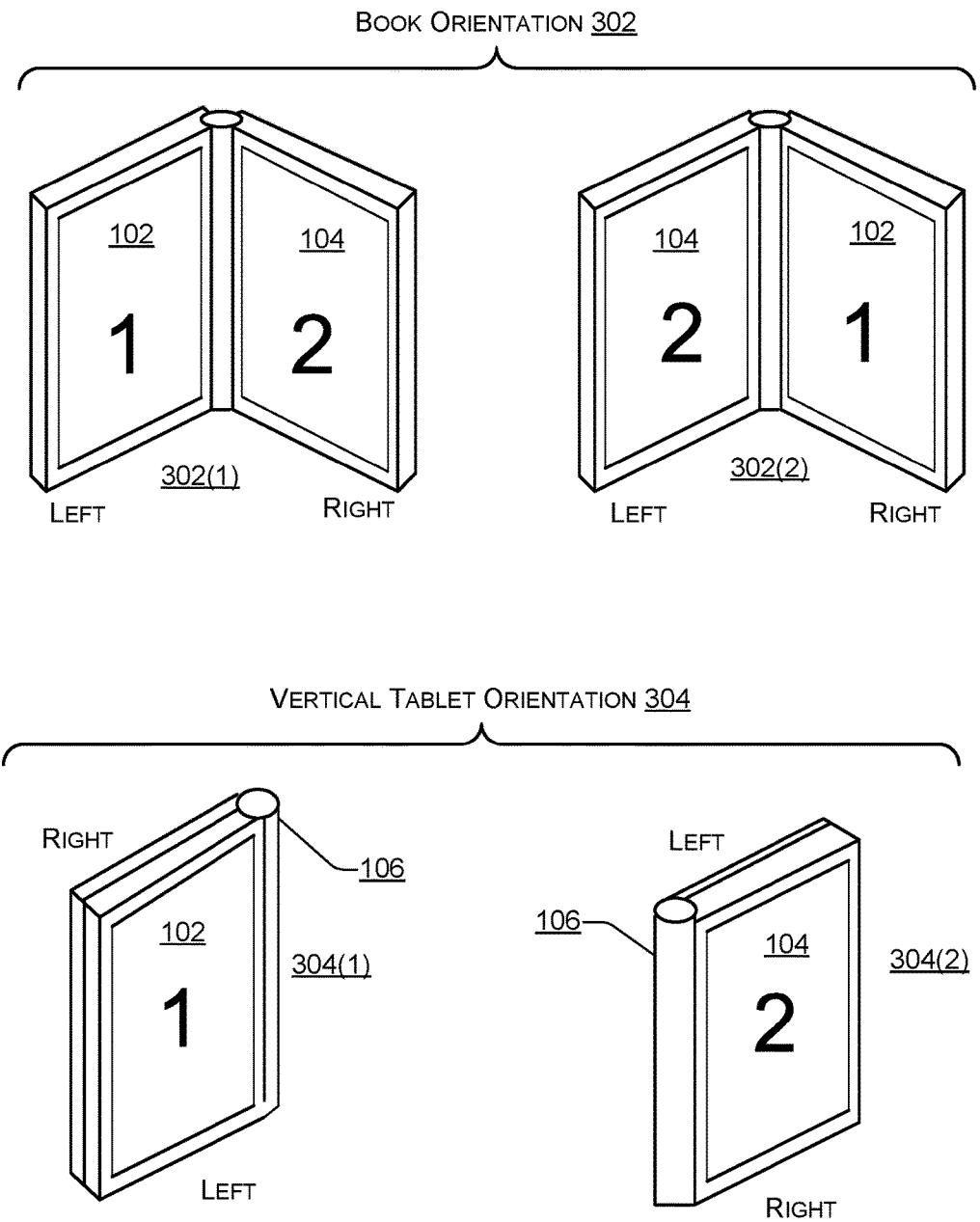
FIG. 3 is a block diagram illustrating different vertical orientations of a dual-housing computing device according to some embodiments.

The computing device 100 may be displayed in a vertical (e.g., portrait) orientation 202 or a horizontal (e.g., landscape) orientation 204. For example, in the vertical orientation 202, the first housing 102 may be on one side (e.g., the left side or the right side), the second housing 104 may be on another side (e.g., the right side or the left side), and the hinge 106 may join the first housing 102 to the second housing 104. Additional examples of the vertical orientation 202 are illustrated in FIG. 3. In the horizontal orientation 204, the first housing 102 may be located at the top (or the bottom) of the computing device 100 with the hinge 106 in the middle and the second housing 104 may be located at the bottom (or the top) of the computing device 100. Additional examples of the horizontal orientation 204 are illustrated in FIG. 4.

FIG. 3 is a block diagram illustrating different vertical orientations of a dual-housing computing device according to some embodiments. Additional examples of the vertical orientation 202 may include a book orientation 302 and a vertical tablet orientation 304. For example, in a first book orientation 302(1), the first housing 102 may be on the left and the second housing 104 may be on the right. Alternately, in a second book orientation 302(2), the second housing 104 may be on the left and the first housing 102 may be on the right.

In the vertical tablet orientation 304, the first housing 102 may be on the left and the second housing 104 may be on the right. In a first vertical tablet orientation 304(1), the first housing 102 may be facing a user and the second housing 104 may be rotated approximately 360 degrees to face away from the user. In a second vertical tablet orientation 304(2), the second housing 104 may be facing the user while the first housing 102 may rotated approximately 360 degrees to face away from the user.

Figure 4:
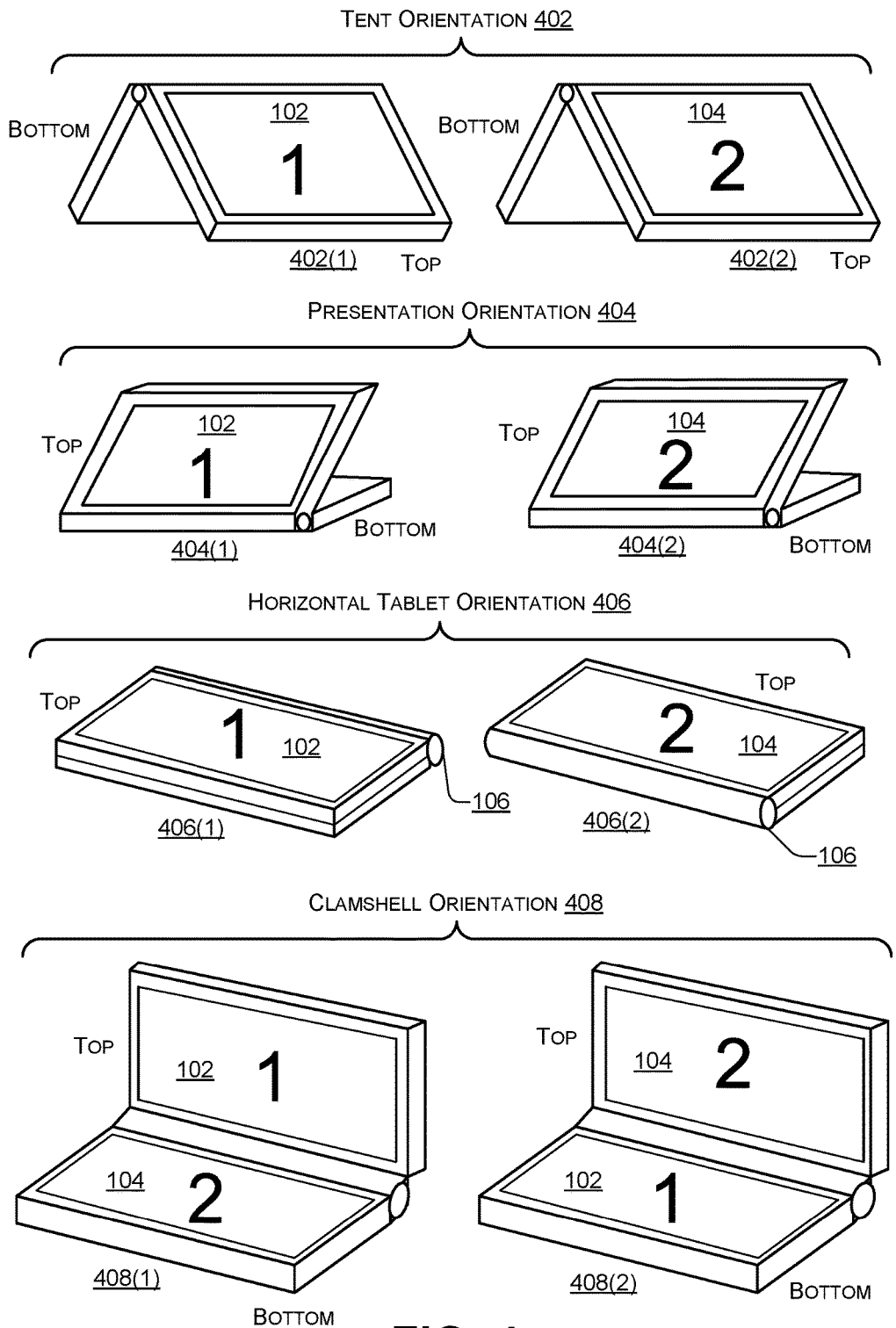
FIG. 4 is a block diagram illustrating different horizontal orientations of a dual-housing computing device according to some embodiments.

FIG. 4 is a block diagram illustrating different horizontal orientations of a dual-housing computing device according to some embodiments. Additional examples of the horizontal orientation 204 may include a tent orientation 402, a presentation orientation 404, a horizontal tablet orientation 406, and a clamshell orientation 408.

In 402(1), the first housing 102 may be at the top facing the user while the second housing 104 may be at the bottom facing away from the user. In 402(2), the second housing 104 may be at the top facing the user and the first housing 102 may be at the bottom facing away from the user.

In 404(1), the first housing 102 may be at the top facing the user and the second housing 104 may be at the bottom facing down. In 404(2) the second housing 104 may be at the top facing the user and the first housing 102 may be at the bottom facing down.

In 406(1), the first housing 102 may be at the top facing the user and the second housing 104 may be at the bottom facing down (e.g., away from the user). In 406(2), the second housing 104 may be at the top facing the user and the first housing 102 may be at the bottom facing down (e.g., away from the user).

In 408(1), the first housing 102 may be at the top facing the user and the second housing 104 may be at the bottom facing the user (e.g., in a position where traditionally, a keyboard is located in a laptop). In 408(1), in some cases, a QWERTY-based keyboard may be displayed on the second housing 104 and used to receive keyboard input. In 408(2), the second housing 104 may be at the top facing the user and the first housing 102 may be at the bottom facing the user (e.g., in a position where traditionally, a keyboard is located in a laptop). In 408(2), in some cases, a QWERTY-based keyboard may be displayed on the first housing 102 and used to receive keyboard input.

Figure 5:
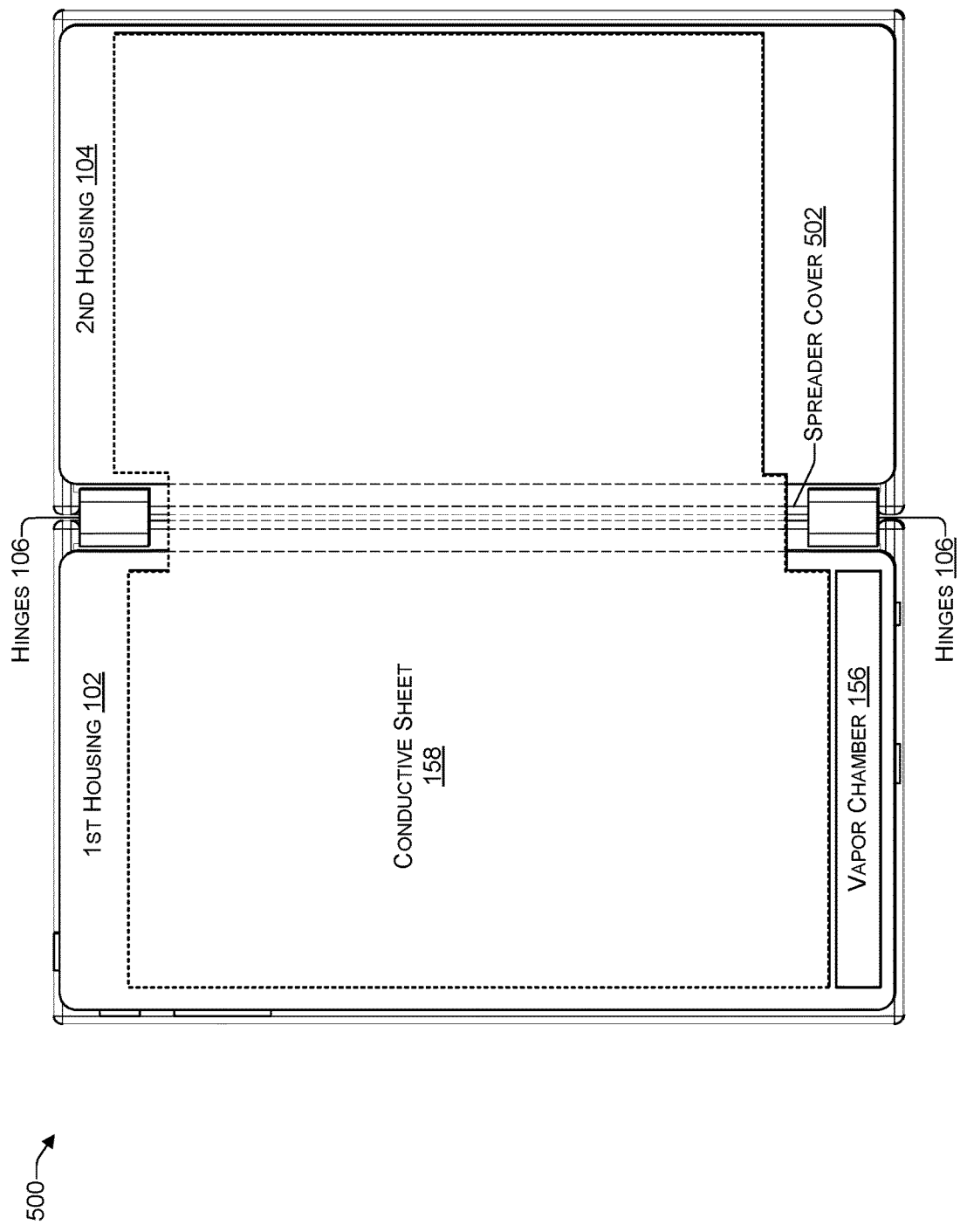
FIG. 5 is a block diagram illustrating a thermally and electrically conductive sheet of a computing device according to some embodiments.

FIG. 5 is a block diagram 500 illustrating a thermally and electrically conductive sheet of a computing device according to some embodiments. The conductive sheet 158 may be placed across the back of one or more of the housings 102, 104 of the computing device 100 of FIG. 1. For example, the conductive sheet 158 may have a length and width that is less than the length and width of one or more of the housings 102, 104. The conductive sheet 158 may be in contact with the vapor chamber 156 (or another type of heat sink used by one or more components housed in the first housing 102).

If the hinges 106 are fairly small (e.g., a sum of the length of all the hinges 106 is less than 50% of the length of the longest side of one of the housings 102, 104), then the conductive sheet 158 may be a single sheet spanning both housings 102, 104, as illustrated in FIG. 5. A small portion of the conductive sheet 158 that spans the two housings 102, 104 may be external to the computing device 100. A spreader cover 502 that is made from a flexible material, such as leather, plastic, cloth, or the like, that is capable of insulating heat may be used to protect the exposed portion of the thermal spreader.

If the hinges 106 are not small (e.g., a sum of the length of all the hinges 106 is greater than or equal to 50% of the length of the longest side of one of the housings 102, 104), then the conductive sheet 158 may be a single sheet spanning both housings 102, 104, and the portion of the thermal spreader 158 that spans the two housings 102, 104 may be threaded through openings (e.g., conduits) in the hinges 106, and the spreader cover 502 may not be used.

The conductive sheet 158 may be electrically conductive for use as an electrical ground for communicating signals between components of the computing device 102. Graphene has a conductivity of about $1 \times 10^8$ Siemens per meter (S/m) while copper has a conductivity of about $6 \times 107$ (S/m). In some cases, impurities introduced during the manufacturing process may cause graphene to have a lower conductivity than $1 \times 108$ S/m, but this can be offset by doping the graphene, e.g., using potassium nitrate (KNO3), Lithium (Li), gold chloride (AuCl3), or other materials. In other cases, impurities may be removed from the graphene, using techniques such as, for example, centrifugation, filtration, precipitation, or decantation, to increase the electrical conductivity of graphene. Thus, graphene can be manufactured with similar or better electrical conductivity than copper, silver, annealed copper, gold, aluminum, and other metals.

Figure 6:
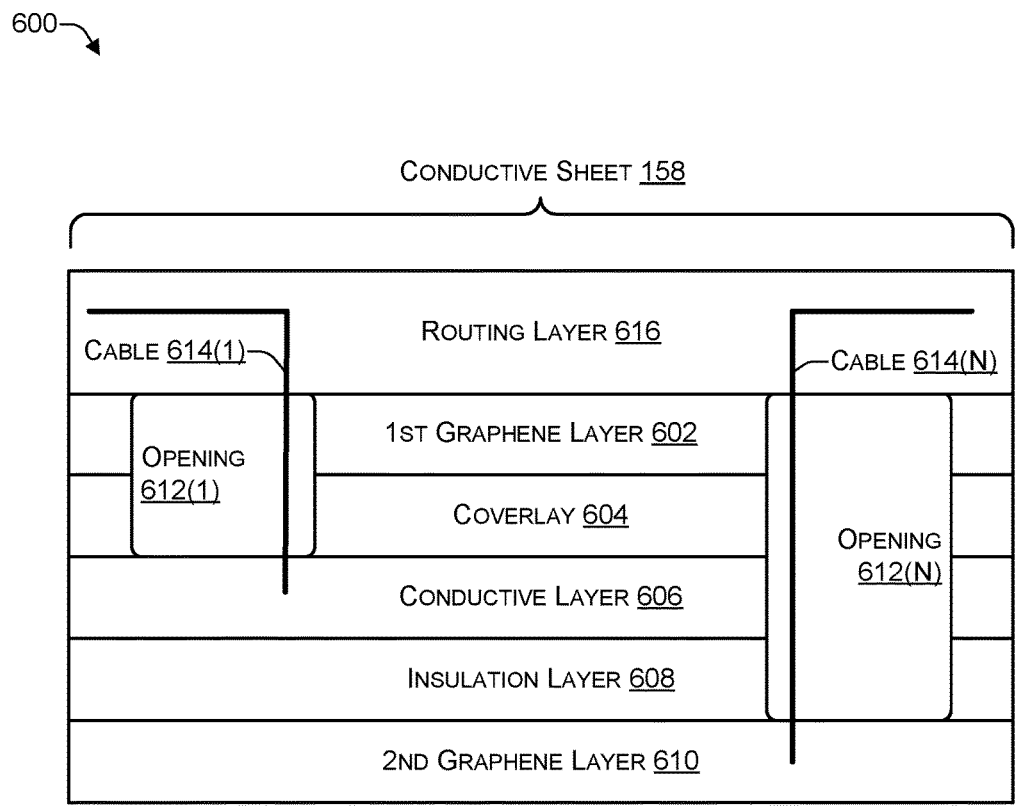
FIG. 6 is a block diagram illustrating layers of a thermally and electrically conductive sheet according to some embodiments.

FIG. 6 is a block diagram 600 illustrating layers of a thermally and electrically conductive sheet according to some embodiments. For example, the conductive sheet 158 of FIG. 1 may include one or more layers, such as, for example, a first graphene layer 602, a coverlay 604, a conductive layer 606, an insulation layer 608, and a second graphene layer 610.

One of the graphene layers 602, 610 may be used for thermal conductivity (e.g., heat dissipation) while the other of the graphene layers 602, 610 may be used for electrical conductivity (e.g., signal ground). For example, the graphene layer 602 may be used for thermal conductivity while the graphene layer 610 may be used for electrical conductivity. Alternately, the graphene layer 610 may be used for thermal conductivity while the graphene layer 602 may be used for electrical conductivity. The coverlay 604 may be a cover (e.g., a film) used to encapsulate and protect the inner layers 606, 608, 610. The coverlay 604 may be flexible to enable the coverlay 604 to withstand being bent back and forth when passing through a hinge. The conductive layer 606 may be used to transmit signals and may be comprised of a conductor, such as, for example, copper, silver, aluminum, gold, or another type of metal or metal alloy.

One or more openings 612, such as opening 612(1) to 612(N) (where N>1), may run vertically in the conductive sheet 158 to enable cables to be electrically connect to the conductive layer 606 and to whichever of the graphene layers 602, 610 is being used as an electrical ground. For example, a cable 614(1) may be routed through a shallow opening, such as the first representative opening 612(1), to enable the cable 614(1) to be connected to the conductive layer 606 (e.g., to transmit one or more signals or provide an electrical ground). A cable 614(N) may be routed through a deeper opening, such as the second representative opening 612(N), to enable the cable 614(N) to be connected to the second graphene layer 610 (e.g., to transmit one or more signals or provide an electrical ground).

By using the conductive sheet 158, (i) one or more layers of polyethylene terephthalate (PET), or Other thermoplastic polymer resin of the polyester family, may be eliminated, direct assembly of the conductive sheet 158 to circuit boards may be simplified, the heat spreading material in the conductive sheet 158 may be contiguous, the openings 612 may be used to connect cables (e.g., wires) in multiple locations, and an additional layer may be added for cable routing. For example, a routing layer 616 that sits on top of the first grapheme layer 602 may be used to route and hold in place the cables 616(1) to 616(N) in the computing device 100.

Figure 7:
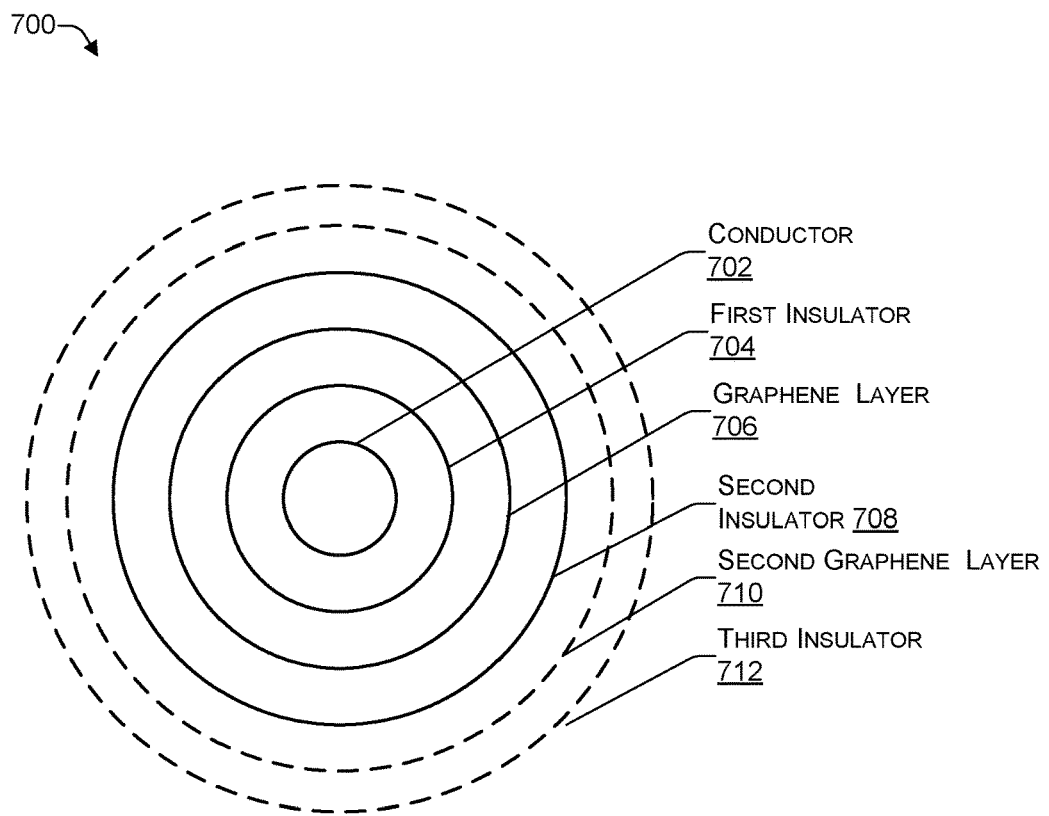
FIG. 7 is a block diagram illustrating a cross-sectional view of a thermally and electrically conductive cable according to some embodiments.

FIG. 7 is a block diagram illustrating a cross-sectional view of a thermally and electrically conductive cable 700 according to some embodiments. For example, the cable 700 may be used to communicate signals between the various components of the computing device 100 of FIG. 1, including between the first housing 102 and the second housing 104. The cable 700 may be run through conduits include the hinges 106. The cable 700 may be used instead of or in addition to the conductive sheet 158 of FIG. 1.

The cable 700 may include multiple layers, such as, for example, a conductor 702, a first insulator 704, a first graphene layer 706, a second insulator 708, a second graphene layer 710, and a third insulator 712. The conductor 702 may be used to transmit signals and may be comprised of, for example, copper, silver, aluminum, gold, or another type of metal or metal alloy. The insulators 704, 708, 712 may comprise a material that is electrically insulating, thermally insulating, or both. For example, the insulators 704, 708, 712 may comprise polyethylene, polytetrafluoroethylene (PTFE), or another similar type of insulator.

In some cases, the graphene layer 706 may provide both an electrical ground and thermal conductivity (e.g., to transfer heat from heat-generating components to areas of the computing device where the heat can dissipate). In other cases, the graphene layer 706 may provide an electrical ground while a second graphene layer 710 may provide thermal conductivity. For example, the second graphene layer 710 may be placed around the second insulator 708. In some cases, an additional third insulator layer 712 may be placed around the second graphene layer 710.

Figure 8:
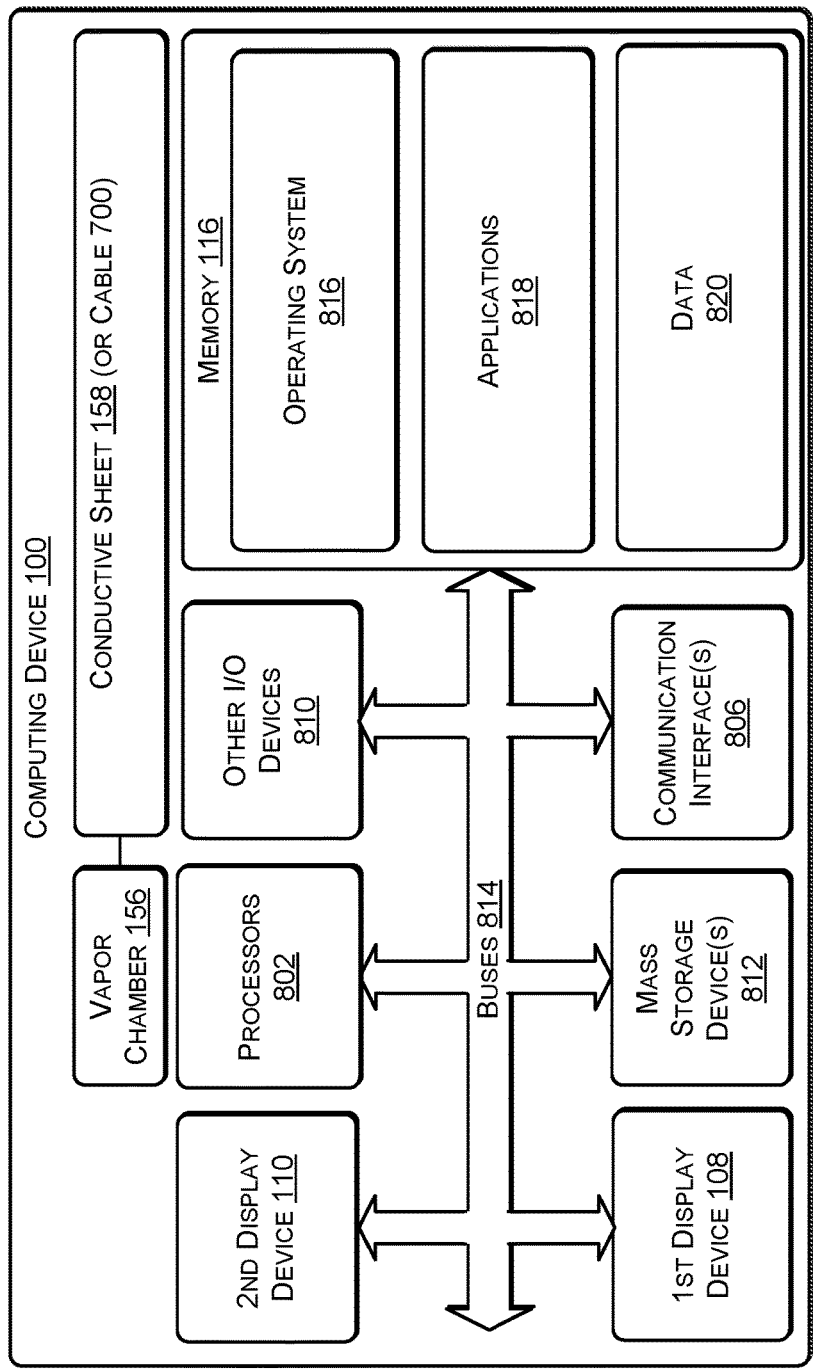
FIG. 8 illustrates an example configuration of a computing device that can be used to implement the systems and techniques described herein.

FIG. 8 illustrates an example configuration of the computing device 100 of FIG. 1 that can be used to implement the systems and techniques described herein. The computing device 100 may include one or more processors 802 (e.g., the CPU 112 and the GPU 114 of FIG. 1), the memory 116, communication interfaces 806 (e.g., including the I/O ports 120), the display devices 108, 110, other input/output (I/O) devices 810 (e.g., keyboard, trackball, and the like, such as the additional components 144), and one or more mass storage devices 812 (e.g., including the memory 116), configured to communicate with each other, such as via one or more system buses 814 (e.g., including the data bus 128, 130) or other suitable connections. While a single system bus is illustrated for ease of understanding, it should be understood that the system buses 814 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 802 are one or more hardware devices that may include a single processing unit or a number of processing units, all of which may include single or multiple computing units or multiple cores. The processors 802 may include the GPU 114 integrated into the CPU 112 or the GPU 114 may be a separate processor device from the CPU 112. The processors 802 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 802 may be configured to fetch and execute computer-readable instructions stored in the memory 116, mass storage devices 812, or other computer-readable media.

Memory 116 and mass storage devices 812 are examples of computer storage media (e.g., memory storage devices) for storing instructions that can be executed by the processors 802 to perform the various functions described herein. For example, memory 116 may include both volatile memory and non-volatile memory (e.g., RAM, ROM, or the like) devices. Further, mass storage devices 812 may include hard disk drives, solid-state drives, removable media, including external and removable drives, memory cards, flash memory, floppy disks, optical disks (e.g., CD, DVD), a storage array, a network attached storage, a storage area network, or the like. Both memory 116 and mass storage devices 812 may be collectively referred to as memory or computer storage media herein, and may be any type of non-transitory media capable of storing computer-readable, processor-executable program instructions as computer program code that can be executed by the processors 802 as a particular machine configured for carrying out the operations and functions described in the implementations herein.

The computing device 100 may also include one or more communication interfaces 806 for exchanging data via a network. The communication interfaces 806 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 806 can also provide communication with external storage, such as a storage array, network attached storage, storage area network, the cloud storage 232, or the like.

The display devices 108, 110 may be located in the housings 102, 104, respectively, and may be are connected using one or more hinges (e.g., the hinges 106 of FIG. 1). The hinges may enable each display device to be placed at an angle relative to the other display device. For example, the display devices 108, 110 may be used for displaying information and images to users. Other I/O devices 810 may be devices that receive various inputs from a user and provide various outputs to the user, and may include a keyboard, a touchpad, a mouse, a printer, audio input/output devices, and so forth.

The computer storage media, such as memory 116 and mass storage devices 812, may be used to store software and data. For example, the computer storage media may be used to store an operating system 816 of the computing device 100 and software applications 818. The memory 116 may also be used to store data 820.

In some implementations, one or more of the computing components, such as the CPU 112, the GPU 114, or the memory 116, may be in contact with a heat sink, such as the vapor chamber 156. The vapor chamber 156 may be located in whichever housing is used to house components that generate the most amount of heat. For example, the vapor chamber 156 may be housed in the same housing as the CPU 112.

The conductive sheet 158 (or the cable 700) may be in contact with the vapor chamber 156. The conductive sheet 158 (or the cable 700) may conduct heat from heat generating components (e.g., CPU 112, GPU 114, or memory 116), via contact with the vapor chamber 156, to a second housing, where the heat is more easily dissipated because components in the second housing may generate less heat than the primary heat generating components (e.g. the housing that includes the CPU 112). Thus, in a computing device with two housings, the conductive sheet 158 (or the cable 700) may span both the first housing and the second housing and may draw heat from components in one housing and dissipate the heat in another housing. In a computing device with a single housing, the conductive sheet 158 (or the cable 700) may draw heat from components in one area of the housing and dissipate the heat in another area of the housing.

The conductive sheet 158 may include one or more layers of a thermally and electrically conductive material, such as graphite/graphene to provide thermal cooling and an electrical ground. In addition, the conductive sheet 158 may include an electrically conductive layer that includes a metal alloy comprising copper, aluminum, another type of material, or any combination thereof. The electrically conductive layer may be used to communicate signals between different components of the computing device 100. The conductive sheet 158 may use at least 3 portions, e.g., a first portion in the first housing, a second portion in the second housing, and a third portion that thermally connects the first portion to the second portion. The third portion of the conductive sheet 158 may be sufficient flexible to enable the first housing to be placed at an angle (e.g., preferably between about 0 to about 180 degrees or between about 0 to about 360 degrees) relative to the second housing. The third portion of the conductive sheet 158 may be capable of thermally conducting heat from the warmer housing to the cooler housing while enabling the first housing to be placed at different angles relative to the second housing. In addition, the third portion of the conductive sheet 158 may be designed to be repeatedly flexed (e.g., articulated) without breaking (or other damage) for an expected life of the computing device 100. In some cases, the third portion of the conductive sheet

158 may be placed inside the one or more hinges. The conductive sheet 158 may be made of a flexible material, such as graphene, enabling a single graphene sheet to be used for both housings.

In some cases, when the hinges are fairly long, the conductive sheet 158 may be threaded through conduits in the hinges. In other cases, when the hinges are fairly small, a portion of the conductive sheet 158 may protrude outside the housings. In such cases, the exposed conductive sheet 158 (e.g., graphene sheet or other material) may be protected using a cover made out of leather, plastic, cloth, or other flexible material with insulating properties.

By using the conductive sheet 158 (or cable 700) that spans both housings, the temperature difference between the two housings of the computing device 100 may be reduced to less than a pre-determined threshold (e.g., preferably less than 6 degrees Fahrenheit and more preferably less than 4 degrees Fahrenheit). For example, the temperature difference between the two sides of the computing device 100 may be reduced to a level that does not cause users to become sufficiently concerned to call customer service. Furthermore, the conductive sheet 158 (or cable 700) may distribute the thermal load across both housings, approximately doubling the surface area available for thermal dissipation. By increasing thermal dissipation using the conductive sheet 158 (or cable 700), components that use more power may be used in the design of the computing device 100. The increased thermal dissipation may enable the computing device 100 to support computational components that consume more power (e.g., thereby generating more heat). For example, the conductive sheet 158 (or cable 700) may enable the computing device 100 to support the CPU 112 with more cores and/or a faster clock speed, a more powerful (e.g., more pipelines, faster clock speed, or the like) GPU 114, more memory 116, a faster memory 116, or any combination thereof.

The conductive sheet 158 (or cable 700) may use one or more graphene layers to provide an electrical ground in addition to thermal conductivity. Graphene (or a graphene composite such as doped graphene) may be used as both a thermal solution and a signaling ground reference, thereby reducing the thickness of computing devices. Signals may be "sandwiched" between two layers of graphene to provide a continuous reference plane (for signal integrity) and ground coupling (for noise suppression). The graphene also provides a thermal solution to enable heat transfer between the two ends of the cable 700 or the conductive sheet 158. Using graphene may provide several benefits, including reducing duplicate layers of plastic (e.g., polyethylene terephthalate or similar) material, simplifying assembly by enabling the conductive sheet 158 (or cable 700) to be attached directly to circuit boards, providing a contiguous (e.g., uninterrupted) surface for thermal spreading, enabling connectors to be applied in multiple locations of the conductive sheet 158 (or cable 700), and enabling one or more layers for cable routing to be added.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A computing device comprising:
    a set of components;
    a conductive sheet comprising:
        a routing layer to route a plurality of cables, the plurality of cables including at least a first cable and a second cable;
        a first graphene layer to dissipate at least a portion of heat generated by a component of the set of components;
        a second graphene layer to provide an electrical ground to one or more signals communicated between the first cable and the second cable;
        a conductive layer through which the one or more signals are communicated; and
        an insulation layer located between the second graphene layer and the conductive layer to insulate the electrical ground from the one or more signals.

2. The computing device of claim 1, wherein:
    the one or more signals include at least one of a data signal or a power signal.

3. The computing device of claim 1, wherein:
    the first graphene layer is in contact with a heat sink attached to at least one component of the set of components.

4. The computing device of claim 3, wherein:
    the heat sink comprises a vapor chamber.

5. The computing device of claim 1, wherein the conductive layer comprises a metal or a metal alloy.

6. The computing device of claim 1, wherein the conductive sheet further comprises:

one or more openings through which at least one of the first cable or the second cable is routed to contact one of:
the conductive layer,
or
the second graphene layer.

7. The computing device of claim 1, wherein at least one of the first graphene layer or the second graphene layer is doped using at least one of potassium nitrate (KNO3), lithium (Li), or gold chloride (AuCl3).

8. A computing device comprising:
a first housing comprising:
a first display device;
a first set of components; and
a heat sink in contact with at least a first component of the first set of components;
a second housing comprising:
a second display device;
a second set of components;
one or more hinges coupling the first housing to the second housing; and
a conductive sheet comprising:
a routing layer to route a plurality of cables, the plurality of cables including at least a first cable and a second cable;
a first graphene layer to dissipate at least a portion of heat generated by the first set of components;
a second graphene layer to provide an electrical ground to one or more signals communicated between a first component of the first set of components and a second component of the second set of components;
a conductive layer through which the one or more signals are communicated; and
an insulation layer located between the second graphene layer and the conductive layer to insulate the electrical ground from the one or more signals.

9. The computing device of claim 8, wherein:
the one or more signals include at least one of a data signal or a power signal.

10. The method of claim 8, wherein:
the first graphene layer is in contact with the heat sink attached to at least one component of the first set of components.

11. The computing device of claim 8, wherein:
at least one of the first grapheme layer or the second grapheme layer is doped using at least one of potassium nitrate (KNO3), lithium (Li), or gold chloride (AuCl3).

12. The computing device of claim 8, wherein:
the heat sink comprises a vapor chamber.

13. The computing device of claim 8, wherein the conductive sheet further comprises:
one or more openings through which at least one of the first cable or the second cable is routed to contact one of:
the conductive layer, or
the second graphene layer.

14. The computing device of claim 8, wherein the conductive layer comprises a metal or a metal alloy.

15. A computing device comprising:
a set of components including a central processing unit (CPU);
a conductive sheet comprising:
a routing layer to route a plurality of cables, the plurality of cables including at least a first cable and a second cable;
a first graphene layer to dissipate at least a portion of heat generated by a component of the set of components;
a second graphene layer to provide an electrical ground to one or more signals communicated between the first cable and the second cable;
a conductive layer through which the one or more signals are communicated; and
an insulation layer located between the second graphene layer and the conductive layer to insulate the electrical ground from the one or more signals.

16. The computing device of claim 15, wherein:
the one or more signals include at least one of a data signal or a power signal.

17. The computing device of claim 15, wherein:
the first graphene layer is in contact with a heat sink that is attached to the CPU.

18. The computing device of claim 15, wherein the conductive layer comprises a metal or a metal alloy.

19. The computing device of claim 15, wherein:
at least one of first graphene layer or the second graphene layer is doped using at least one of potassium nitrate (KNO3), lithium (Li), or gold chloride (AuCl3).

20. The computing device of claim 15, further comprising:
a first housing that includes a first display device and the set of components;
a second housing that includes a second display device, wherein the conductive layer electrically couples the set of components in the first housing with a second set of components in the second housing, the second set of components comprising the second display device; and
one or more hinges attaching the first housing to the second housing.

* * * * *